(12) United States Patent
Xing et al.

(10) Patent No.: US 9,805,956 B2
(45) Date of Patent: Oct. 31, 2017

(54) LEAD FRAME AND A METHOD OF FABRICATION THEREOF

(71) Applicants: Dawei Xing, Singapore (SG); Jie Liu, Singapore (SG); Hong Wei Guan, Singapore (SG); Yue Gen Yu, Singapore (SG); Seow Kiang Khoo, Singapore (SG)

(72) Inventors: Dawei Xing, Singapore (SG); Jie Liu, Singapore (SG); Hong Wei Guan, Singapore (SG); Yue Gen Yu, Singapore (SG); Seow Kiang Khoo, Singapore (SG)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 84 days.

(21) Appl. No.: 13/747,774

(22) Filed: Jan. 23, 2013

(65) Prior Publication Data
US 2014/0202736 A1  Jul. 24, 2014

(51) Int. Cl.
*H01L 21/48* (2006.01)
*H01L 21/56* (2006.01)
*H01L 23/31* (2006.01)
*H01L 23/495* (2006.01)
(Continued)

(52) U.S. Cl.
CPC ........ *H01L 21/4828* (2013.01); *H01L 21/561* (2013.01); *H01L 23/3121* (2013.01); *H01L 23/49558* (2013.01); *H01L 23/49582* (2013.01); *H01L 23/49861* (2013.01); *H05K 1/02* (2013.01); *H01L 2224/32245* (2013.01); *H01L 2224/45144* (2013.01); *H01L 2224/48091* (2013.01); *H01L 2224/48247* (2013.01); *H01L 2224/73265* (2013.01)

(58) Field of Classification Search
CPC ......... H01L 23/49534; H01L 23/49558; H01L 23/49582; H01L 23/49861; H01L 21/4828; H01L 21/4832; Y10T 29/49121
See application file for complete search history.

(56) References Cited

U.S. PATENT DOCUMENTS 5,548,890 A * 8/1996 Tada et al. ............... 29/827
7,977,161 B2 * 7/2011 Chiang ............ H01L 21/4832
257/E21.502

(Continued)

*Primary Examiner* — Livius R Cazan
(74) *Attorney, Agent, or Firm* — Ostrolenk Faber LLP

(57) ABSTRACT

Disclosed is a method of manufacturing a lead frame, which comprises the steps of: providing an electrically-conductive base material having first and second planar sides; forming a plurality of conductive contact points on the first planar side of the base material; providing a non-conductive filling material over the first planar side of the base material so that the filling material fills spaces in-between the plurality of contact points to a form a layer comprising the filling material and the plurality of contact points; and etching the second planar side of the base material to expose a pattern of the filling material from the second planar side of the base material and to thereby form a plurality of isolated conductive regions on the second planar side of the base material, each isolated conductive region being connected with at least a respective one of the plurality of contact points on the first planar side of the base material. A lead frame structure is also disclosed.

14 Claims, 9 Drawing Sheets

(51) Int. Cl.
   *H01L 23/498*   (2006.01)
   *H05K 1/02*    (2006.01)

(56) References Cited

U.S. PATENT DOCUMENTS

| | | | |
|---|---|---|---|
| 2008/0048311 A1* | 2/2008 | Ikenaga | H01L 21/4828 |
| | | | 257/690 |
| 2008/0174981 A1* | 7/2008 | Chan et al. | 361/813 |
| 2009/0283884 A1* | 11/2009 | Kang | H01L 21/4832 |
| | | | 257/676 |
| 2011/0267789 A1 | 11/2011 | Chew et al. | |
| 2012/0001306 A1* | 1/2012 | Wang et al. | 257/666 |
| 2013/0175707 A1* | 7/2013 | Chew | H01L 23/49537 |
| | | | 257/778 |

* cited by examiner

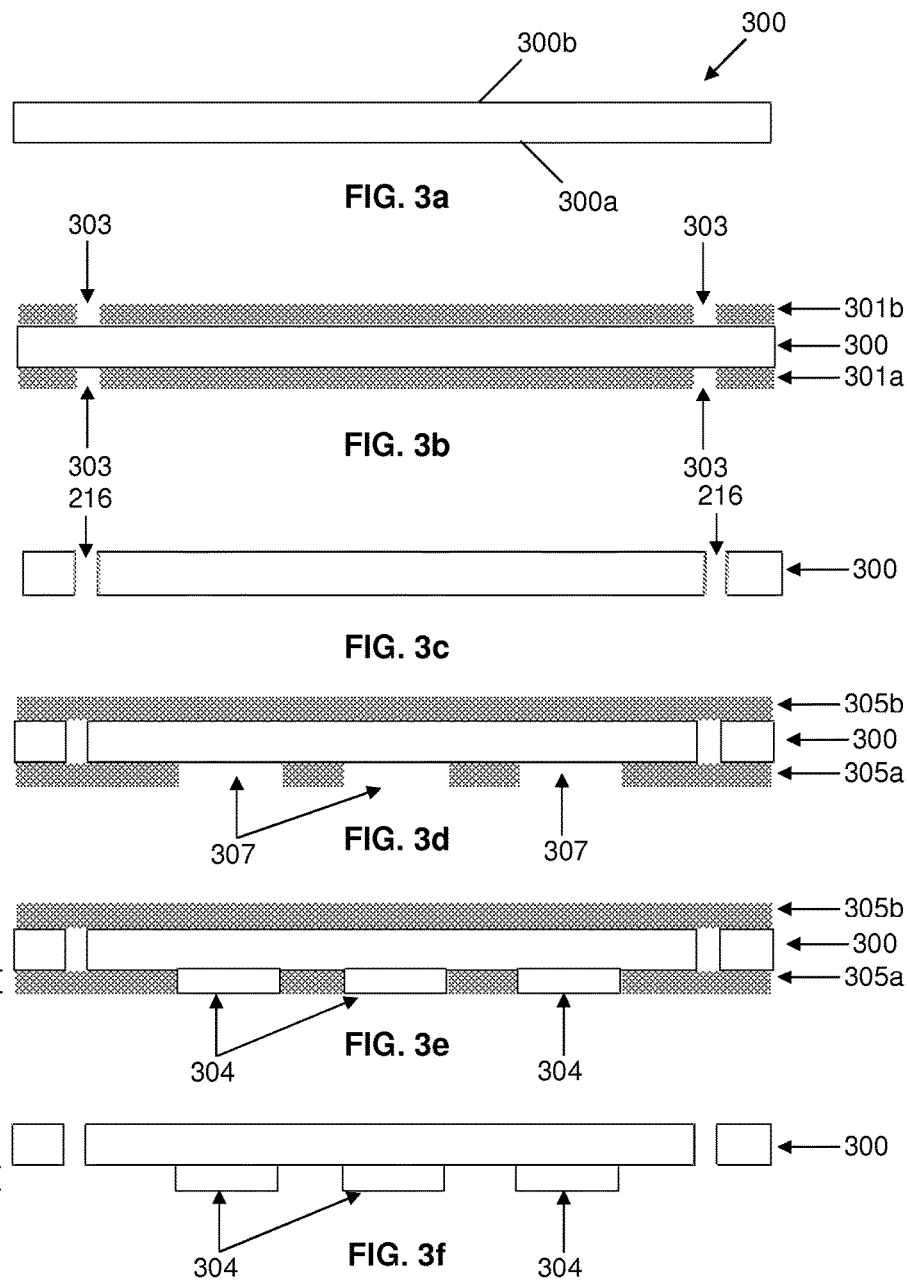

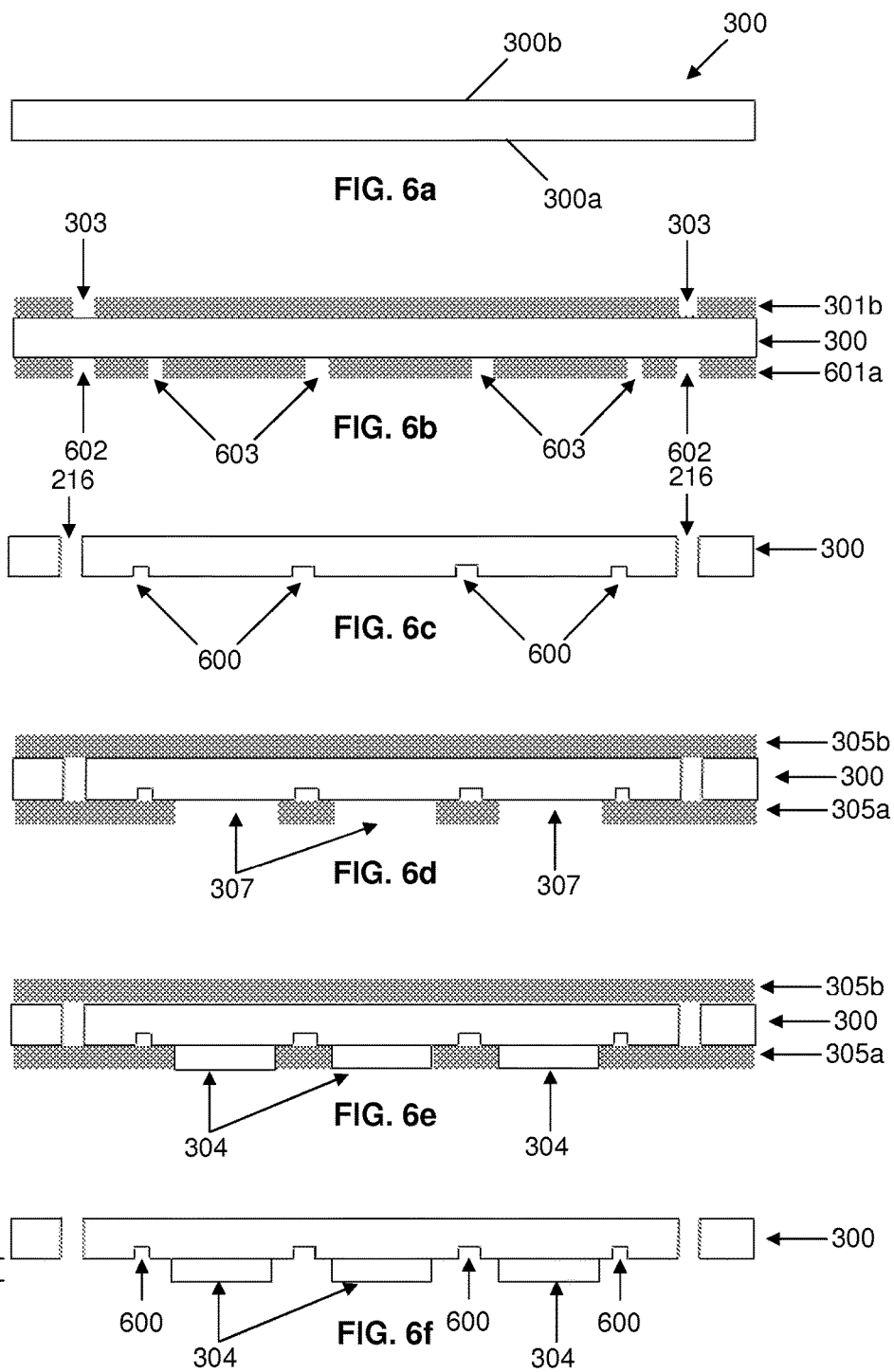

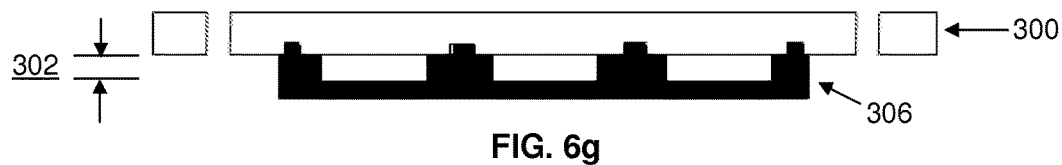
FIG. 6g
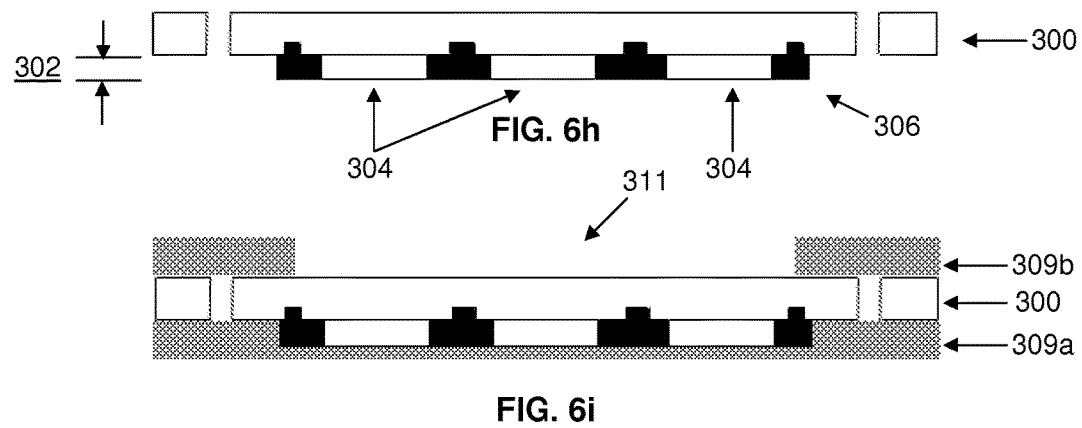
FIG. 6h
FIG. 6i
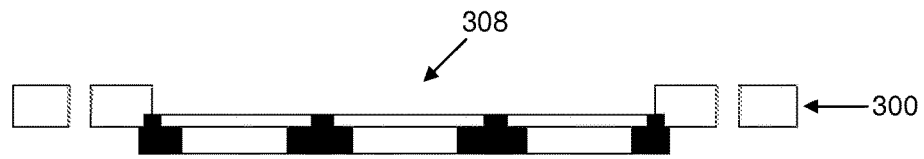
FIG. 6j
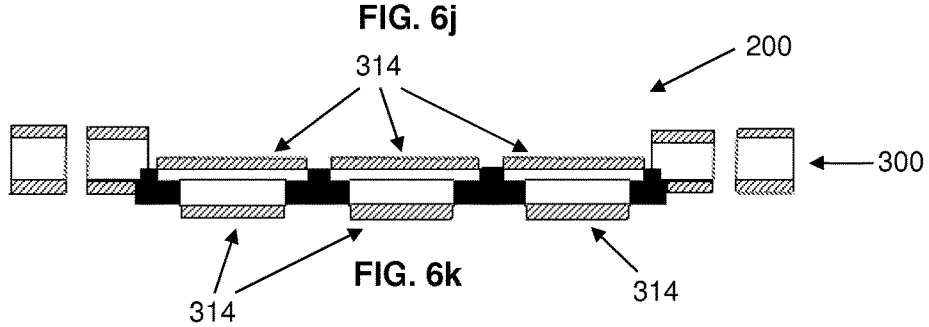
FIG. 6k

LEAD FRAME AND A METHOD OF FABRICATION THEREOF

TECHNICAL FIELD OF THE INVENTION

This invention relates to a lead frame and a method of fabricating the lead frame that is particularly, but not exclusively, for supporting semiconductor dies during semiconductor packaging.

BACKGROUND OF THE INVENTION

Lead frames are typically used during semiconductor packaging to serve as an electrical interconnect between semiconductor dies of semiconductor packages and external circuitries. Lead frames are also commonly used in the fabrication of semiconductor packages because they provide an efficient form of heat dissipation. Semiconductor packaging first involves dicing a semiconductor wafer to separate semiconductor dies on the semiconductor wafer. After dicing of the semiconductor wafer has been completed, the semiconductor dies are then individually attached to respective die pads of the lead frame via die bonding, and thereafter, electrical connections are formed between each semiconductor die and the respective leads of the lead frame via wire bonding using fine wires. Subsequently, the lead frame is encased within a mold to encapsulate each of the semiconductor dies with an encapsulant (e.g. epoxy resin) by injection molding or compression molding.

With the dual impact of increasing miniaturisation and processing capability among modern day electronic packages, there is now an ever-greater demand for semiconductor packaging processes and/or tools to achieve a higher density of electrical connections between semiconductor dies and lead frames compared with conventional methods and devices, in order to reduce the form factor or size of electronic packages. This has resulted in the introduction of new semiconductor package structures and methods of fabrication thereof in the back-end semiconductor industry.

For instance, US 2011/0267789 proposes a semiconductor package structure and a method of fabrication thereof, which is illustrated in FIGS. 1a to 1d. FIG. 1a shows a first metal layer 120 and a second metal layer 130 that are formed on a conductive carrier 110 by electrolytic plating. Specifically, it can be seen from FIG. 1a that the first metal layer 120 forms a plurality of lead pads 121 and a die-attach pad 122, while the second metal layer 130 forms a plurality of bond pads 131 and die-attach barriers 132. FIG. 1b shows that whilst the first and second metal layers 120, 130 are being supported on the conductive carrier 110, a semiconductor die 160 is bonded to the die-attach pad 122 and electrical interconnections are formed between the semiconductor die 160 and the bond pads 131. The first and second metal layers 120, 130 and the semiconductor die 160 are then encapsulated by an encapsulation layer 170 as shown in FIG. 1c, and the conductive carrier 110 is thereafter removed from the semiconductor package structure as shown in FIG. 1d.

By providing the conductive carrier 110 to support the first and second metal layers 120, 130, the separation between the bond pads 131 and the die-attach barriers 132 may be reduced to increase the density of electrical interconnections between the semiconductor die 160 and the bond pads 131. However, one limitation of the approach used in US 2011/0267789 is the need to remove the conductive carrier 110 by chemical etching after the encapsulation layer 170 has been formed. Accordingly, the step of removing the conductive carrier 110 presents an additional process in the fabrication that may increase the complexity and costs of fabricating the semiconductor package structure.

Thus, it is an object of the present invention to seek to propose a lead frame as well as a method of fabrication thereof that at least ameliorates the limitation of US 2011/0267789 as described, and to provide the general public with a useful choice.

SUMMARY OF THE INVENTION

A first aspect of the invention is a method of manufacturing a lead frame, which comprises the steps of: providing an electrically-conductive base material having first and second planar sides; forming a plurality of conductive contact points on the first planar side of the base material; providing a non-conductive filling material over the first planar side of the base material so that the filling material fills spaces in-between the plurality of contact points to form a layer comprising the filling material and the plurality of contact points; and etching the second planar side of the base material to expose a pattern of the filling material from the second planar side of the base material and to thereby form a plurality of isolated conductive regions on the second planar side of the base material, each isolated conductive region being connected with at least a respective one of the plurality of contact points on the first planar side of the base material.

A second aspect of the invention is a lead frame comprising: i) an electrically-conductive base material having first and second planar sides; ii) a plurality of conductive contact points on the first planar side of the base material; and iii) a non-conductive filling material over the first planar side of the base material and filling spaces in-between the plurality of contact points to form a layer comprising the base material and the plurality of contact points, wherein a pattern of the filling material is exposed from the second planar side of the base material which thereby form a plurality of isolated conductive regions on the second planar side of the base material, each isolated conductive region being connected with at least a respective one of the plurality of contact points on the first planar side of the base material.

BRIEF DESCRIPTION OF THE DRAWINGS

Preferred embodiments of the invention will be described, with reference to the accompanying drawings, of which:

FIG. 2a and FIG. 2b show opposite planar sides of a lead frame according to the preferred embodiment of the invention, while

FIGS. 3a-3m show the steps of fabricating the lead frame of FIGS. 2a to 2c;

FIG. 6a-6k show an alternative process for fabricating the lead frame of FIGS. 2a to 2c.

DETAILED DESCRIPTION OF THE PREFERRED EMBODIMENTS

Figure 1A:
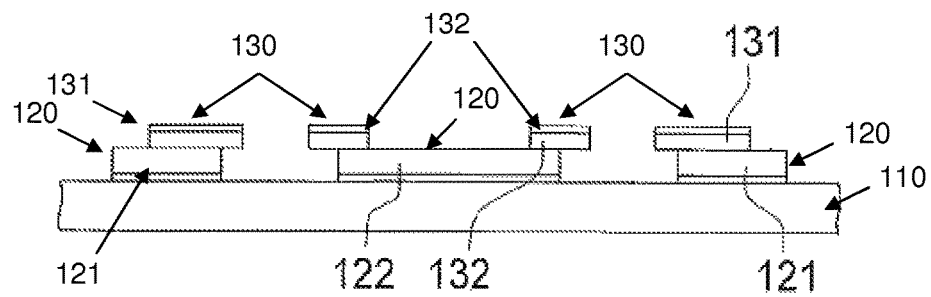
FIGS. 1a to 1d show the steps of a known method of fabricating a semiconductor package structure.
Figure 1B:
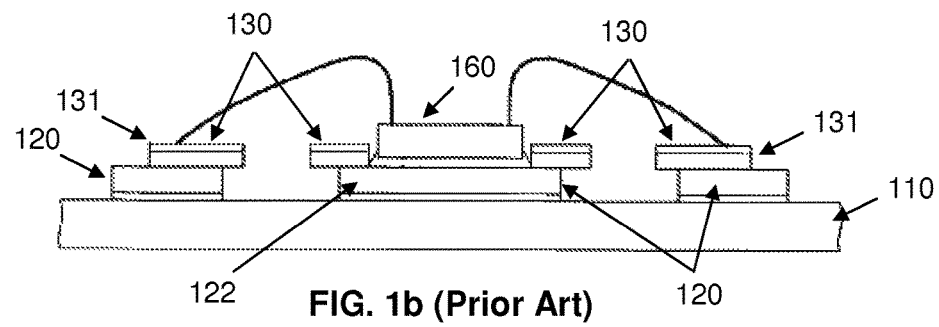
Figure 1C:
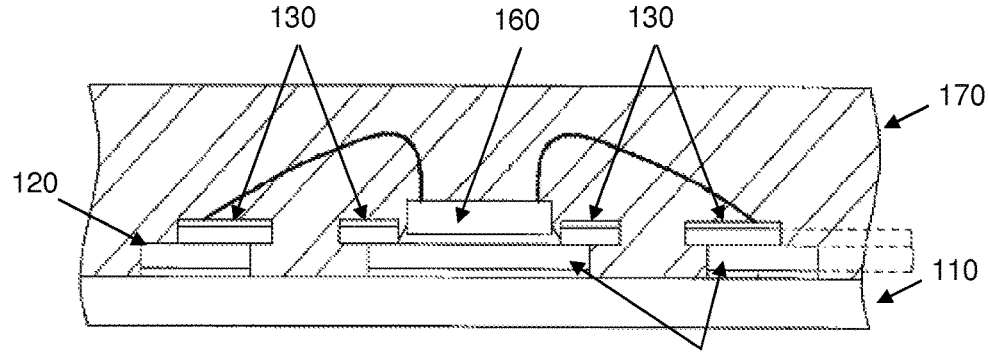
Figure 1D:
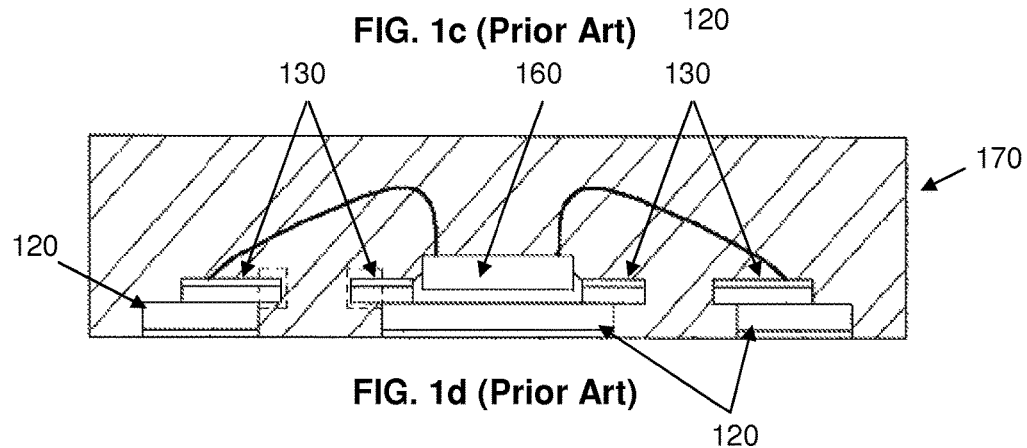
Figure 2A:
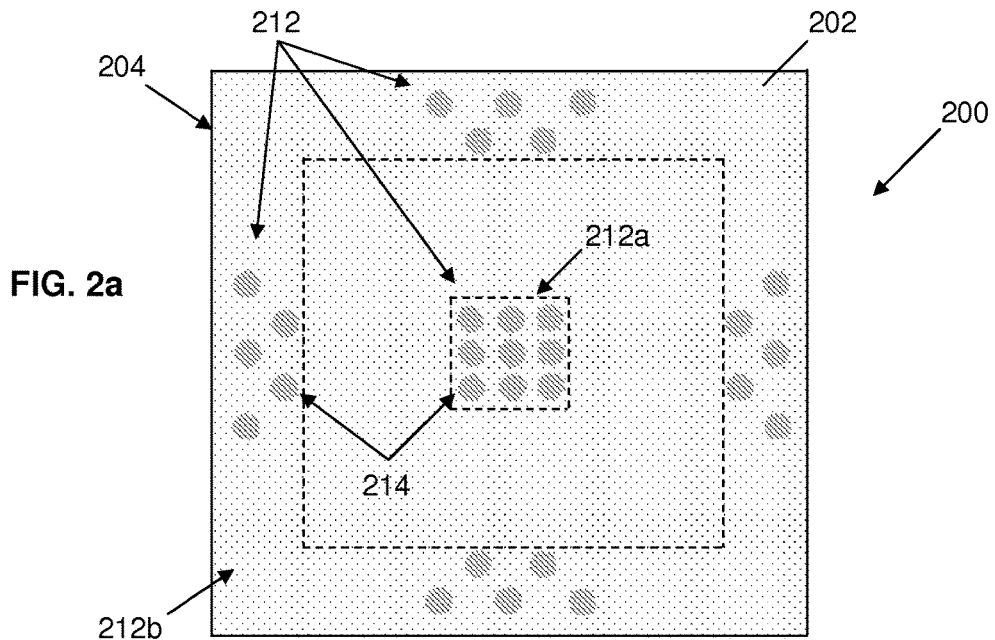
Figure 2B:
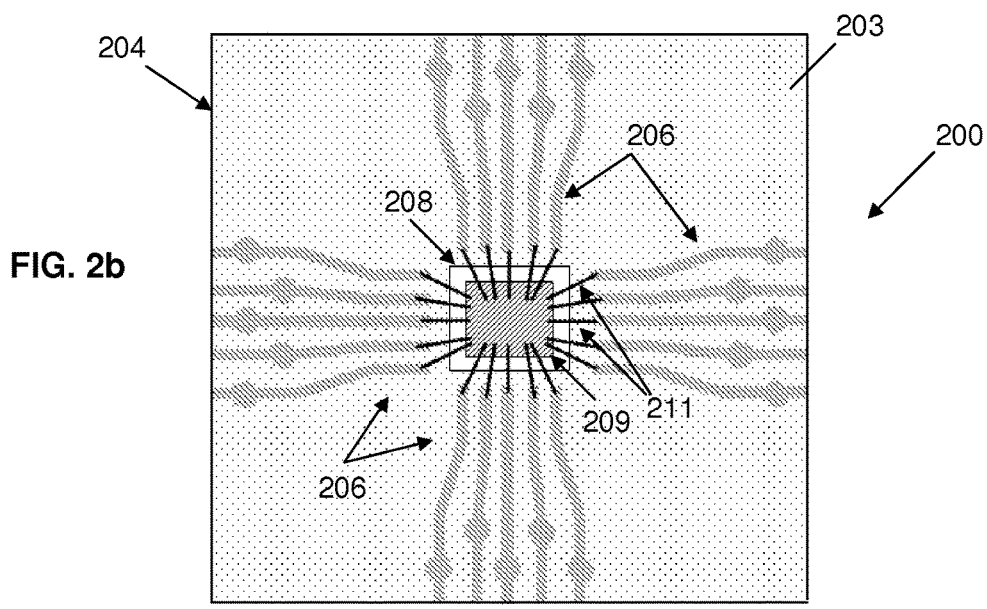
Figure 2C:
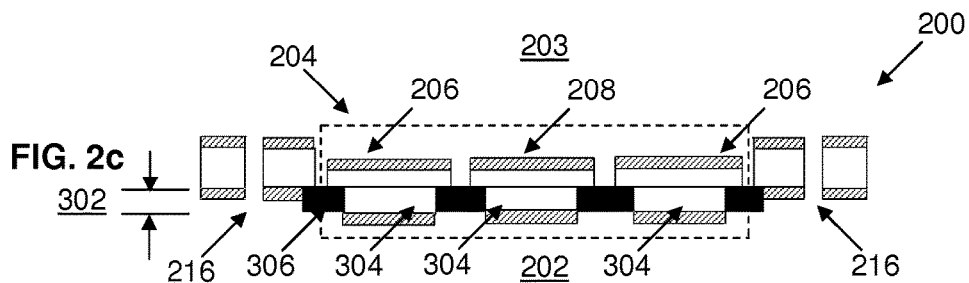
FIG. 2c shows a cross-sectional view of the lead frame.

FIGS. 2a and 2b show a first planar side 202 and a second planar side 203 respectively of a lead frame 200 according to a preferred embodiment of the invention, whereas FIG. 2c shows a cross-sectional view of the lead frame 200.

In particular, FIG. 2a shows a soldering side of a die-attach region 204 on the first planar side 202 of the lead frame 200 that electrically connects a semiconductor die (shown in FIG. 2b by the reference numeral 209) bonded onto the lead frame 200 to a substrate, such as a printed circuit board (PCB). FIG. 2a also shows a conductive pattern 212 on the soldering side of the die-attach region 204, comprising a central region 212a and a peripheral region 212b having electrically-conductive contact points 214 for electrical connection between the semiconductor die and the substrate. In particular, the conductive points 214 in the peripheral region 212b are arranged in inner and outer rings to increase the density of electrical interconnections in the lead frame 200. The arrangement of the conductive points 214 in the conductive pattern 212 aligns with corresponding adjacent conductive pads on the substrate to which the soldering side of the final semiconductor package structure is mounted. A pitch (or separation) distance between adjacent conductive points 214 in the peripheral region 212b measures about 0.5 mm.

FIG. 2b shows a bonding side of the die-attach region 204, comprising leads 206 and a die-attach pad 208. After the semiconductor die 209 is bonded to the die-attach region 204, bonding wires 211 (e.g. Copper or Gold wires) are used to form electrical interconnections between the semiconductor die 209 and the leads 206 of the die-attach region 204. It can be seen that the leads 206 of the die-attach region 204 include a fine pitch configuration, wherein the pitch distance between adjacent leads 206 nearest to the semiconductor die 209 measures about 90 microns.

FIG. 2c shows a cross-sectional view of the lead frame 200. Specifically, it can be seen that the first planar side 202 of the lead frame 200 comprises a patterned conductive layer 302, which comprises a plurality of Copper pillars 304 each having a thickness of about 4 mils (i.e. about 0.1 mm). In addition, a non-conductive filling compound 306 fills the spaces in-between the plurality of Copper pillars 304 and, accordingly, the filling compound 306 and the plurality of Copper pillars 304 form a layer of the lead frame 200. It can also be seen that the second planar side 203 of the lead frame 200 is etched to expose a filling pattern for the filling compound 306 from the second planar side 203, thereby forming a plurality of isolated conductive regions on the second planar side 203 that accordingly define the leads 206 and the die-attach pad 208 on the bonding side of the die-attach region 204 after filling. Each of these isolated conductive regions on the second planar side 203 is electrically connected with at least a respective one of the Copper pillars 304 on the first planar side 202 of the lead frame 200. Furthermore, the lead frame 200 also comprises multiple etched reference through-holes 216 for engaging (e.g. locking) with a lead frame carrier during semiconductor packaging. This advantageously aids in positioning the lead frame 200 and ensures the stability of the lead frame 200 during semiconductor packaging.

FIGS. 3a-3m show the steps of fabricating the lead frame 200.

FIG. 3a shows a cross-section of an electrically-conductive base material 300 having first and second planar sides 300a, 300b. The conductive base material 300 is a copper alloy having a thickness of about 4 to 20 mils (i.e. about 0.1 mm to 0.5 mm). It should, however, be appreciated that the base material 300 may also comprise other types of metallic alloy so long as they are electrically conductive.

FIG. 3b shows a cross-sectional view of the base material 300 having photoresist layers 301a, 301b coated onto the first and second planar sides 300a, 300b respectively. In particular, the photoresist layers 301a, 301b comprise openings 303 at positions corresponding to the positions of the through-holes 216 of the lead frame 200. Preferably, each of the photoresist layers 301a, 301b is formed by first coating a uniform layer of the photoresist layer by lamination, screen-printing or spin-coating, before a required image corresponding to the arrangement of the through-holes 216 is imprinted thereon using UV radiation so as to remove portions of the photoresist layer 301a, 301b corresponding to the arrangement of the through-holes 216. Thereafter, the exposed portions of the first and second planar sides 300a, 300b of the base material 300 are etched through using an etching solution, such as cupric chloride, ferric chloride, or ammonia-base alkaline. Subsequently, the photoresist layers 301a, 301b are removed from the base material 300 as shown in FIG. 3c. Removal of the photoresist layers 301a, 301b may be accomplished by way of aqueous dissolution in an alkaline solution. It should be appreciated that the through-holes 216 may be pilot holes that could be alternatively formed by stamping or drilling.

FIG. 3d shows a cross-sectional view of the base material 300 having photoresist layers 305a, 305b coated on the first and second planar sides 300a, 300b respectively. Whereas the photoresist layer 305b on the second planar side 300b of the base material 300 defines a complete layer, the photoresist layer 305a on the first planar side 300a comprises openings 307 at positions corresponding to the positions of the Copper pillars 304 of the lead frame 200. Likewise, each of the photoresist layers 305a, 305b is formed by first coating a uniform layer of the photoresist layer by lamination, screen-printing or spin-coating. Thereafter, a required image corresponding to the arrangement of the Copper pillars 304 is imprinted on the photoresist layer 305a on the first planar side 300a of the base material 300 using UV radiation, so as to remove portions of the photoresist layer 305a corresponding to the positions where the Copper pillars 304 are to be plated.

Figure 5:
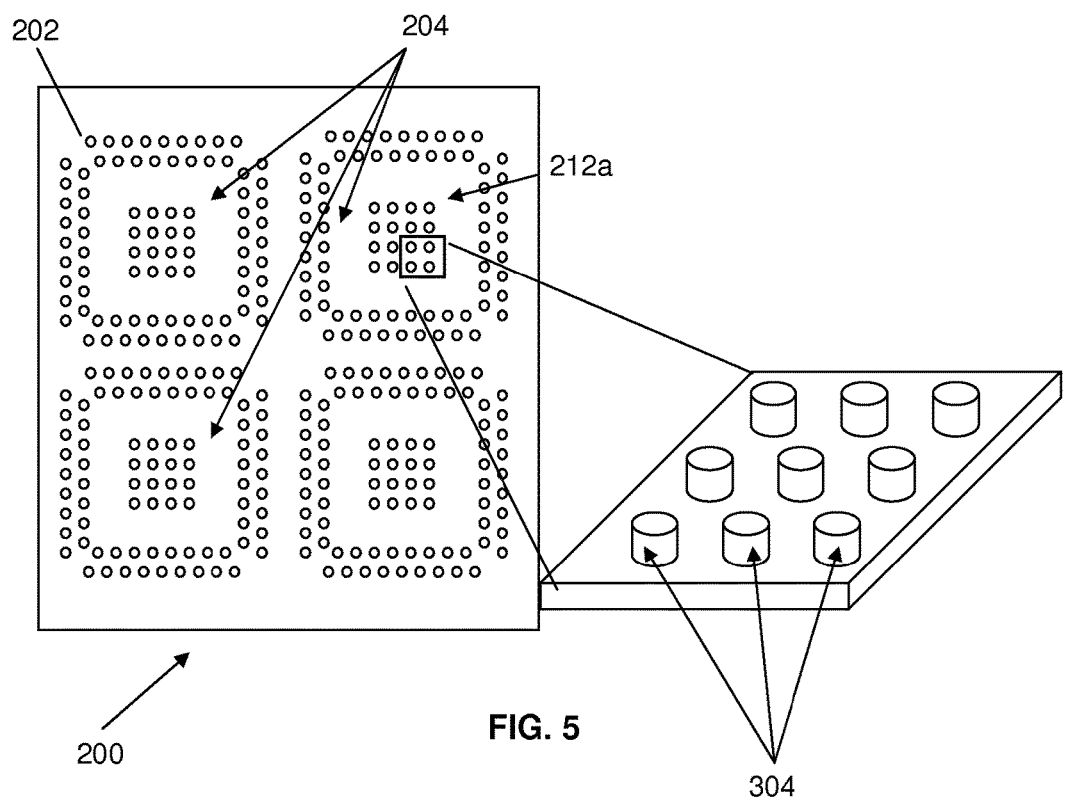
FIG. 5 is an isometric view of one of the planar sides of the lead frame, and includes a magnified portion of the same.

Through electrolytic plating, a patterned conductive layer 302 comprising the Copper pillars 304 is thereby formed in the openings 307 of the photoresist layer 305a on the first planar side 300a of the conductive base material 300, as shown in FIG. 3e. The patterned conductive layer 302 is defined by a plurality of Copper pillars 304, each having a thickness of about 4 mils (i.e. 0.1 mm). Referring to FIG. 5, it is seen that each Copper pillar 304 has a generally cylindrical structure with a diameter of about 0.25 mm. It should, however, be appreciated that the patterned conductive layer 302 may comprise other metals such as Gold, Nickel, Palladium and/or Silver. In addition, the Copper pillars 304 may also have other structures (e.g. a cuboidal structure) besides the cylindrical structure as shown in FIG. 5. Subsequently, the photoresist layers 305a, 305b are removed from the base material 300 as shown in FIG. 3f. Removal of the photoresist layers 305a, 305b may be accomplished by way of aqueous dissolution in an alkaline solution.

It should be noted that besides electrolytic plating, the Copper pillars 304 may also be formed by printing a conductive material, such as copper paste or copper ink, directly on the desired portions of the first planar side 300a of the base material 300, followed by a curing or sintering process to allow the conductive material to solidify.

Figure 3G:
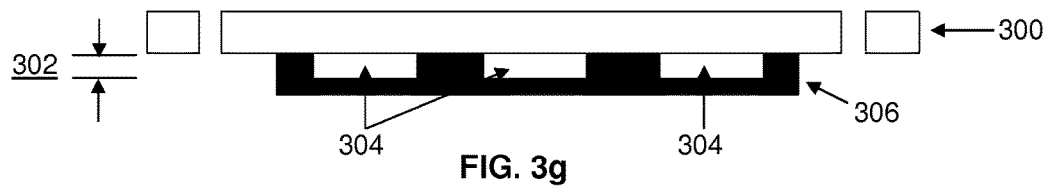
Figure 3H:
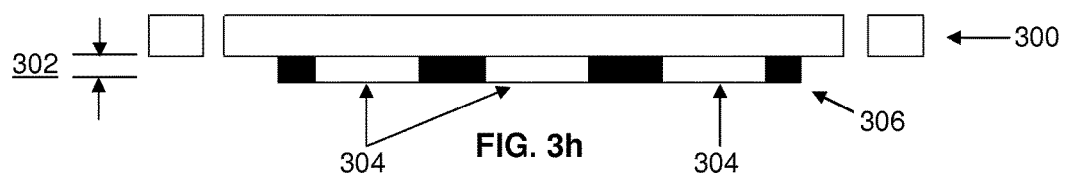

FIG. 3g shows a cross-sectional view of the first planar side 300a of the base material 300 being filled by the non-conductive filling compound 306 such that the filling compound 306 fills the spaces in-between the patterned conductive layer 302. For compatibility with downstream processes, the filling compound 306 is preferably a thermoset type of plastic molding compound that is commonly used in the semiconductor packaging industry. However, the filling compound 306 may comprise any material (e.g. an epoxy molding compound) so long as it is not electrically conductive. In particular, it is seen that the filling compound 306 flows over the patterned conductive layer 302; the thickness of the filling compound 306 that flows over the patterned conductive layer 302 is about 4 mils (about 0.1 mm). However, it should be appreciated that the filling compound 306 may also flow over the patterned conductive layer 302 by any predetermined thickness. Deflashing of the filling compound 306 by either chemical deflashing or mechanical deflashing (e.g. grinding) is then carried out to remove the excess filling compound 306, such that the Copper pillars 304 comprised in the patterned conductive layer 302 are exposed from the first planar side 300a of the base material 300 as shown in FIG. 3h. FIG. 3h also shows a layer comprising the filling compound 306 and the plurality of Copper pillars 304 formed on the first planar side 300a of the base material 300, wherein the Copper pillars 304 are exposed.

Figure 3I:
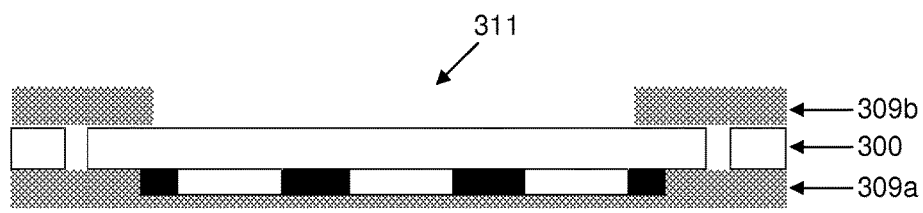

FIG. 3i shows a cross-sectional view of the base material 300 having photoresist layers 309a, 309b coated on the first and second planar sides 300a, 300b respectively. Whereas the photoresist layer 309a on the first planar side 300a of the base material 300 completely covers the first planar side 300a, the photoresist layer 309b on the second planar side 300b has an opening 311 at a position corresponding to the position of a major portion 308 of the second planar side 300b that defines the bonding side of the die-attach region 204. Similarly, each of the photoresist layers 309a, 309b is formed by coating a uniform layer of the photoresist layer by lamination, screen-printing or spin-coating. Thereafter, a required image corresponding to the position of the major portion 308 of the second planar side 300b is imprinted on the photoresist layer 309a on the second planar side 300b of the base material 300 using UV radiation, so as to remove a portion of the photoresist layer 309b corresponding to the position of the major portion 308 of the second planar side 300b that defines the bonding side of the die-attach region 204.

Figure 3J:
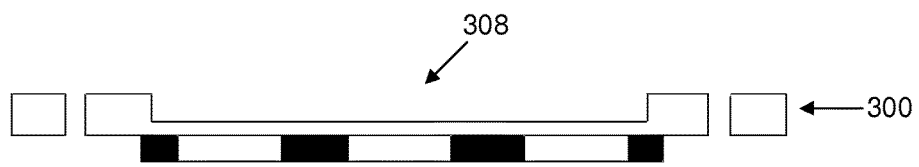

The exposed portion of the second planar side 300b of the base material 300 is then etched to a certain depth through using an etching solution, such as cupric chloride, ferric chloride, or ammonia-base alkaline. Subsequently, the photoresist layers 309a, 309b are removed from the base material 300 as shown in FIG. 3j. Removal of the photoresist layers 309a, 309b may be accomplished by way of aqueous dissolution in an alkaline solution. Specifically, FIG. 3j shows a cross-section of the base material 300, wherein the major portion 308 of the second planar side 300b has been etched to cause the base material 300 at the major portion 308 to have a predetermined thickness of about 1 mil (i.e. 0.025 mm).

Figure 3K:
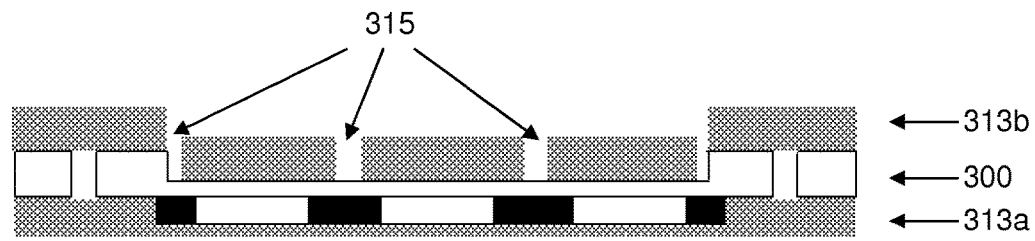

FIG. 3k shows a cross-sectional view of the base material 300 having photoresist layers 313a, 313b coated on the first and second planar sides 300a, 300b respectively. Whereas the photoresist layer 313a on the first planar side 300a of the base material 300 completely covers the first planar side 300a, the photoresist layer 313b on the second planar side 300b comprises openings 315 at positions corresponding to a desired pattern 312 of the filling material 306. Again, each of the photoresist layers 313a, 313b is formed by coating a uniform layer of the photoresist layer by lamination, screen-printing or spin-coating. Thereafter, a required image corresponding to the desired pattern 312 of the filling material 306 is imprinted on the photoresist layer 313b on the second planar side 300b of the base material 300 using UV radiation, so as to remove a portion of the photoresist layer 313b corresponding to the desired pattern 312 of the filling material 306.

Figure 3L:
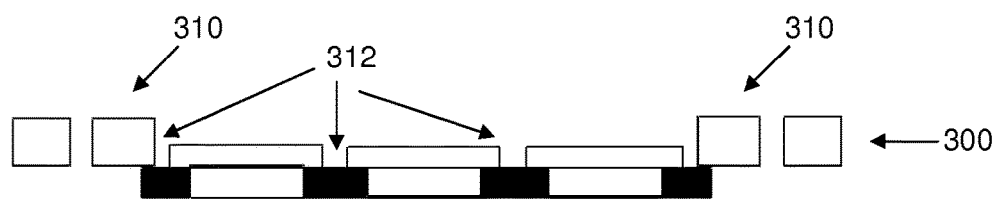

The exposed portion of the second planar side 300b of the base material 300 is then etched through using an etching solution, such as cupric chloride, ferric chloride, or an ammonia-based alkaline. Subsequently, the photoresist layers 313a, 313b are removed from the base material 300 as shown in FIG. 3l. Removal of the photoresist layers 313a, 313b may be accomplished by way of aqueous dissolution in an alkaline solution. Specifically, FIG. 3l shows a cross-sectional view of the base material 300, wherein the etched major portion 308 of the second planar side 300b is further selectively etched until the desired pattern 312 is obtained through which the filling material 306 is exposed. Consequently, a plurality of isolated conductive regions is formed on the second planar side 300b of the base material 300, wherein each isolated conductive region is connected with at least a respective one of the Copper pillars 304 on the first planar side 300a of the base material 300. The etched major portion 308 of the second planar side 300b thus allows fine pitch patterning of the second planar side 300b of the base material 300. Accordingly, complex circuit routing can be achieved. On the other hand, a minor portion 310 of the second planar side 300b that defines a periphery of the base material 300 is left intact and consequently maintains its original thickness of about 4 to 20 mils (i.e. about 0.1 mm to 0.5 mm). The unetched periphery of the base material 300 thus provides a sufficiently strong structure by which the base material 300 can be supported and held.

Figure 3M:
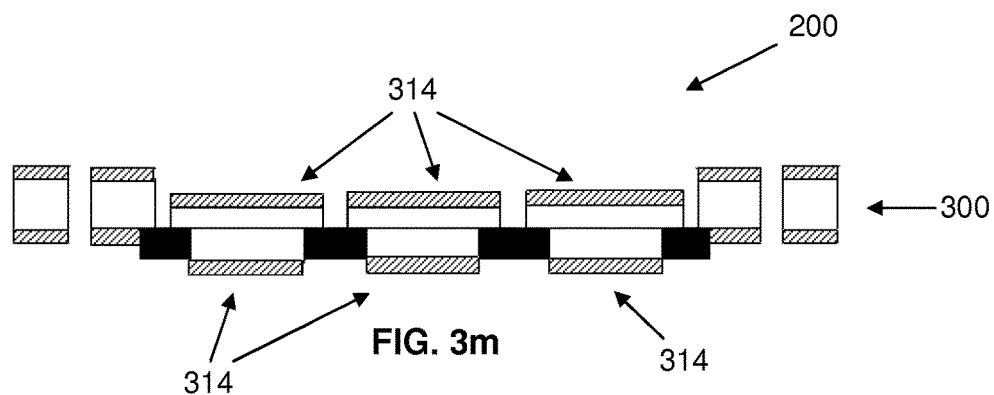

FIG. 3m shows a cross-sectional view of the base material 300, wherein the selectively-etched major portion 308 of the second planar side 300b, together with the Copper pillars 304 on the first planar side 300a, of the base material 300 are plated by a conductive material 314 such as Nickel, Palladium, Gold or Silver. Accordingly, the die-attach pad 208 and the leads 206 are formed and the fabrication of the lead frame 200 is completed. By plating the major portion 308 of the second planar side 300b of the base material 300, connectivity between the leads 206 and the fine wires, and between the die-attach pad 208 and a semiconductor die can be enhanced.

Figure 4A:
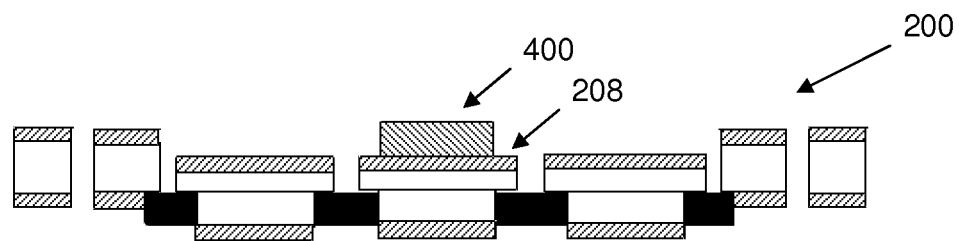
FIGS. 4a-4d show the steps of fabricating a final semiconductor package structure using the lead frame fabricated by the steps of FIGS. 3a to 3m.
Figure 4B:
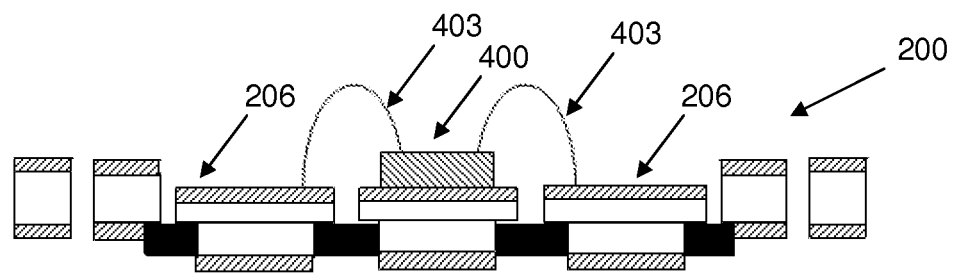
Figure 4C:
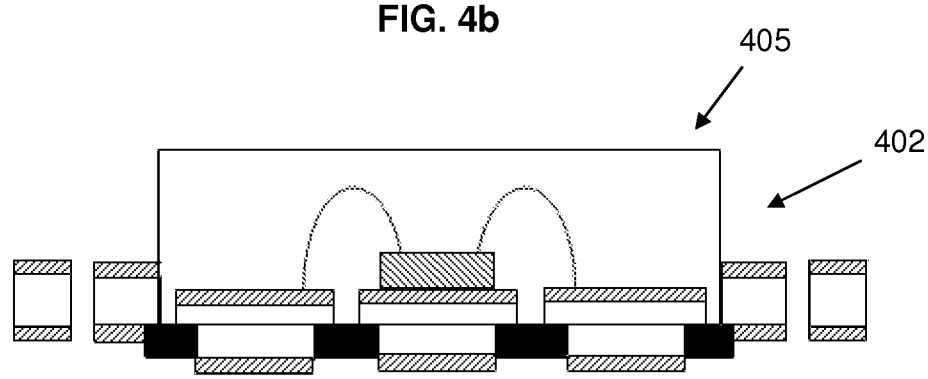
Figure 4D:
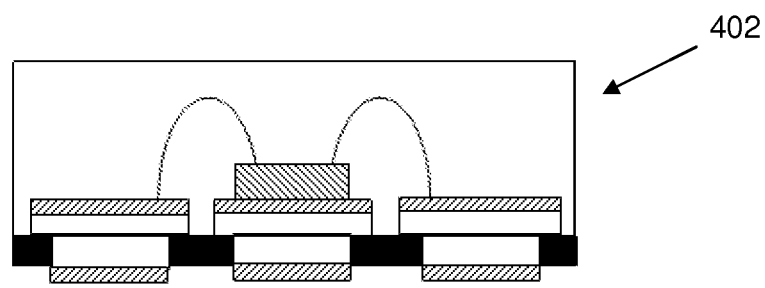

FIGS. 4a-4d show the steps of fabricating the final semiconductor package structure using the lead frame 200. Specifically, FIG. 4a shows a semiconductor die 400 attached to the die-attach pad 208 via die bonding. FIG. 4b shows electrical connections being formed between inputs and/or outputs terminals of the semiconductor die 400 and the respective leads 206 of the lead frame 200 via wire bonding using bonding wires 403. FIG. 4c shows the semiconductor die 400 being encapsulated by an encapsulant 405 (e.g. an epoxy molding compound), preferably by injection molding or compression molding, to form a final semiconductor package structure 402. Finally, FIG. 4c shows the final semiconductor package structure 402 being separated from the lead frame 200, preferably by a singulation process.

FIG. 5 is an isometric view of the first planar side 202 of the lead frame 200, showing the soldering side of a plurality of die-attach regions 204. FIG. 5 also includes a magnified portion of the central region 212a of one of the die-attach regions 204, comprising a plurality of Copper pillars 304. Specifically, each Copper pillar 304 has a generally cylindrical structure with a diameter of about 0.25 mm. It should, however, be appreciated that the patterned conductive layer 302 may comprise other metals such as Gold, Nickel, Palladium and/or Silver. In addition, the Copper pillars 304 may also have other structures (e.g. a cuboidal structure) besides the cylindrical structure as shown.

Having fully described the invention, it should be apparent to one of ordinary skill in the art that many modifications can be made without departing from the scope as claimed. For instance, it should be appreciated that the lead frame 200 may comprise multiple arrays of die-attach regions 204, each array comprising multiple rows and columns of individual die-attach regions 204 in which individual semiconductor dies (not shown) are bonded thereto.

Moreover, FIGS. 6a to 6k show an alternative process for fabricating the lead frame 200 of FIGS. 2a to 2c. In particular, and in contrast to the earlier-described process as shown in FIGS. 3a to 3m, FIGS. 6b and 6c show that the alternative process performs a step of partial etching of the base material 300 to form partially-etched portions 600 together with the step of etching the base material 300 to form the reference through-holes 216 of the lead frame 200. Specifically, the partially-etched portions 600 correspond to the desired pattern 312 of the filling material 306 to be exposed on the second planar side 300b of the base material 300. This is done by coating photoresist layers 601a, 301b on the first and second planar sides 300a, 300b of the base material 300 respectively, wherein the photoresist layer 601a that is coated on the first planar side 300a of the base material 300 comprises openings 602, 603 at positions corresponding to the desired positions of the through-holes 216 and the partially-etched portions 600 of the base material 300 respectively. Accordingly, the alternative process differs from the earlier-described process in the sense that whereas the step of etching the base material 300 to expose the desired pattern 312 of the filling material 306 in the earlier-described process is performed on the second planar side 300b of the base material 300 (see FIG. 3k), the step of partially etching the base material 300 to form the partially-etched portions 600 in this alternative process is performed on the first planar side 300a of the base material 300 (see FIG. 6b). Consequently, the desired pattern 312 of the filling material 306 (through which the filling material 306 is exposed on the second planar side 300b of the base material 300) is directly obtained after the step of etching the major portion 308 along the second planar side 300b of the base material 300 in this alternative process—see FIG. 6j. As the rest of the steps involved in the alternative process are either similar or identical to the earlier-described process, their descriptions will apply to those steps of the alternative process.

The invention claimed is:

1. A method of manufacturing a lead frame, the method comprising the steps of:
    providing an electrically-conductive base material having first and second planar sides;
    partially etching the first planar side of the base material to form partially etched portions and forming holes through the electrically-conductive base material, which are outside of the partially etched portions, simultaneously with the partially etched portions;
    forming a plurality of conductive contact points onto portions of the surface of the first planar side of the base material, wherein:
        the step of forming the plurality of conductive contact points comprises forming a conductive layer, which is separate from the base material, onto the surface of the first planar side of the base material; and
        the partially etched portions are located in between the plurality of conductive contact points;
    providing a non-conductive filling material over a flat planar surface of the first planar side of the base material so that the filling material fills the partially etched portions and spaces in between the plurality of conductive contact points to form a continuous layer comprising the filling material and the plurality of conductive contact points such that a thickness of the filling material is equal to a thickness of the conductive layer wherein the plurality of contact points are exposed; and
    etching the second planar side of the base material to expose a pattern of the filling material in the partially etched portions from the second planar side of the base material and to thereby form a plurality of isolated conductive regions on the second planar side of the base material, each isolated conductive region being connected with at least a respective one of the plurality of contact points on the surface of the first planar side of the base material,
    wherein the steps included in the method are performed without a die being attached to the base material.

2. The method of claim 1, wherein the step of forming the plurality of contact points onto the portions of the surface of the first planar side of the base material comprises the steps of:
    providing a photo-resist layer on the first planar side of the base material, wherein the photo-resist layer comprises openings at positions corresponding to the positions of the plurality of contact points to be formed onto the portions of the surface of the first planar side of the base material;
    plating a conductive material at the openings of the photo-resist layer to form the plurality of conductive points; and
    removing the photo-resist layer from the first planar side of the base material.

3. The step of claim 1, wherein the step of forming the plurality of contact points onto the portions of the surface of the first planar side of the base material comprises the steps of:
    printing a conductive material onto those portions of the first planar side of the base material; and
    allowing the conductive material to solidify.

4. The method of claim 1, wherein the step of providing the filling material over the flat planar surface of the first planar side of the base material is performed until the filling material flows over the plurality of conductive points by a predetermined thickness.

5. The method claim 4, wherein the predetermined thickness is about 0.1 mm.

6. The method of claim 4, further comprising the step of removing excess filling material from the first planar side of the base material after the step of providing the filling material over the flat planar surface of the first planar side of the base material to expose the plurality of contact points.

7. The method of claim 1, wherein forming the holes through the electrically-conductive base material comprises the steps of:
    providing photo-resist layers on the first and second planar sides of the base material, the photo-resist layers comprising openings at positions corresponding to the positions of the through-holes to be formed in the base material;

etching the base material at the openings of the photo-resist layers to form the through-holes; and removing the photo-resist layers from the first and second planar sides of the base material.

8. The method of claim 7, wherein the step of etching the second planar side of the base material to expose the pattern of the filling material from the second planar side of the base material comprises the steps of etching the second planar side of the base material to a predetermined etched thickness, and subsequently, further etching the second planar side of the base material selectively until the pattern of the filling material is exposed from the second planar side of the base material.

9. The method of claim 8, wherein the predetermined etched thickness to which the second planar side of the base material is etched is about 0.025 mm.

10. The method of claim 1, wherein the step of partially etching the first planar side of the base material to form partially etched portions and forming the holes through the electrically-conductive base material includes the steps of:

providing photo-resist layers on the first and second planar sides of the base material, the photo-resist layers comprising openings at positions corresponding to the positions of the holes, and the photo-resist layer on the first planar side of the base material further comprising openings at positions corresponding to the partially etched portions to be formed in the base material;

etching the base material at the openings of the photo-resist layers to form the holes and the partially etched portions; and removing the photo-resist layers from the first and second planar sides of the base material.

11. The method of claim 10, wherein the step of etching the second planar side of the base material comprises the step of etching the second planar side of the base material to a predetermined etched thickness until the pattern of the filling material is exposed from the second planar side of the base material.

12. The method of claim 11, wherein the predetermined etched thickness to which the second planar side of the base material is etched is about 0.025 mm.

13. The method of claim 1, further comprising the step of plating the plurality of contact points on the first planar side of the base material and the plurality of conductive regions on the second planar side of the base material.

14. A method of manufacturing a lead frame, the method comprising the steps of:

providing an electrically-conductive base material having first and second planar sides;

partially etching the first planar side of the base material to form partially etched portions and forming holes through the electrically-conductive base material, which are outside of the partially etched portions, simultaneously with the partially etched portions;

forming a plurality of conductive contact points onto portions of the surface of the first planar side of the base material, wherein:

the step of forming the plurality of conductive contact points comprises forming a conductive layer, which is separate from the base material, onto the surface of the first planar side of the base material; and the partially etched portions are located in between the plurality of conductive contact points;

providing a non-conductive filling material over a flat planar surface of the first planar side of the base material so that the filling material fills the partially etched portions and spaces in between the plurality of conductive contact points to form a continuous layer comprising the filling material and the plurality of conductive contact points such that a thickness of the filling material is equal to a thickness of the conductive layer wherein the plurality of contact points are exposed; and etching the second planar side of the base material to expose a pattern of the filling material in the partially etched portions from the second planar side of the base material and to thereby form a plurality of isolated conductive regions on the second planar side of the base material, each isolated conductive region being connected with at least a respective one of the plurality of contact points on the surface of the first planar side of the base material, wherein the steps included in the method are performed without a die being attached to the base material; and a single partially etched portion is located between adjacent conductive contact points of the plurality of conductive contact points.

* * * * *